United States Patent
Marieb et al.

(10) Patent No.: US 11,749,560 B2
(45) Date of Patent: Sep. 5, 2023

(54) CLADDED METAL INTERCONNECTS

(71) Applicant: INTEL CORPORATION, Santa Clara, CA (US)

(72) Inventors: Thomas Marieb, Portland, OR (US); Zhiyong Ma, Portland, OR (US); Miriam R. Reshotko, Portland, OR (US); Christopher Jezewski, Portland, OR (US); Flavio Griggio, Portland, OR (US); Rahim Kasim, Portland, OR (US); Nikholas G. Toledo, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1157 days.

(21) Appl. No.: 16/141,522

(22) Filed: Sep. 25, 2018

(65) Prior Publication Data
US 2020/0098619 A1    Mar. 26, 2020

(51) Int. Cl.
*H01L 21/768*    (2006.01)
*H01L 23/532*    (2006.01)
(Continued)

(52) U.S. Cl.
CPC ........ *H01L 21/76802* (2013.01); *C23C 18/48* (2013.01); *C25D 3/58* (2013.01);
(Continued)

(58) Field of Classification Search
CPC .......................... H01L 21/76802–76817; H01L 21/76877–76883;
(Continued)

(56) References Cited

U.S. PATENT DOCUMENTS

| | | | |
|---|---|---|---|
| 6,084,302 A | 7/2000 | Sandhu | |
| 2003/0111729 A1* | 6/2003 | Leu | H01L 21/288 |
| | | | 257/E23.152 |

(Continued)

OTHER PUBLICATIONS

U.S. Appl. No. 15/937,527, filed Mar. 27, 2018, 26 pages.

*Primary Examiner* — Laura M Menz
*Assistant Examiner* — Candice Chan
(74) *Attorney, Agent, or Firm* — Schwabe, Williamson & Wyatt P.C.

(57) ABSTRACT

Techniques are disclosed for providing cladded metal interconnects. Given an interconnect trench, a barrier layer is conformally deposited onto the bottom and sidewalls of the trench. A first layer of a bilayer adhesion liner is selectively deposited on the barrier layer, and a second layer of the bilayer adhesion liner is selectively deposited on the first layer. An interconnect metal is deposited into the trench above the bilayer adhesion liner. Any excess interconnect metal is recessed to get the top surface of the interconnect metal to a proper plane. Recessing the excess interconnect metal may include recessing previously deposited excess adhesion liner and barrier layer materials. The exposed top surface of the interconnect metal in the trench is then capped with the bilayer adhesion liner materials to provide a cladded metal interconnect core. In some embodiments, the adhesion liner is a single layer adhesion liner.

19 Claims, 13 Drawing Sheets

(51) Int. Cl.
    *C25D 3/58* (2006.01)
    *C23C 18/48* (2006.01)
(52) U.S. Cl.
    CPC .. *H01L 21/76849* (2013.01); *H01L 21/76852* (2013.01); *H01L 23/53223* (2013.01); *H01L 23/53238* (2013.01)
(58) Field of Classification Search
    CPC ....... H01L 21/76814–76876; H01L 23/53223; H01L 23/53238
    See application file for complete search history.

(56) References Cited

U.S. PATENT DOCUMENTS

2016/0225665 A1    8/2016  Yoo et al.
2018/0096888 A1*   4/2018  Naik ................ H01L 21/76883

\* cited by examiner

CLADDED METAL INTERCONNECTS

BACKGROUND

In the manufacture of integrated circuits, interconnects are generally formed on a semiconductor substrate using a copper dual damascene process. Such a process typically begins with a trench and via being etched into a dielectric layer and then filled with a barrier/adhesion layer and a seed layer using a physical vapor deposition (PVD) sputtering process. An electroplating process is then used to fill the via and trench with copper metal to form the interconnect. However, continued down scaling of device dimensions and feature sizes give rise to non-trivial performance issues.

BRIEF DESCRIPTION OF THE DRAWINGS

FIG. 4H' illustrates a variation of the cap formed over the top surface of the interconnect metal, in accordance with an embodiment of the present disclosure.

Figure 1A:
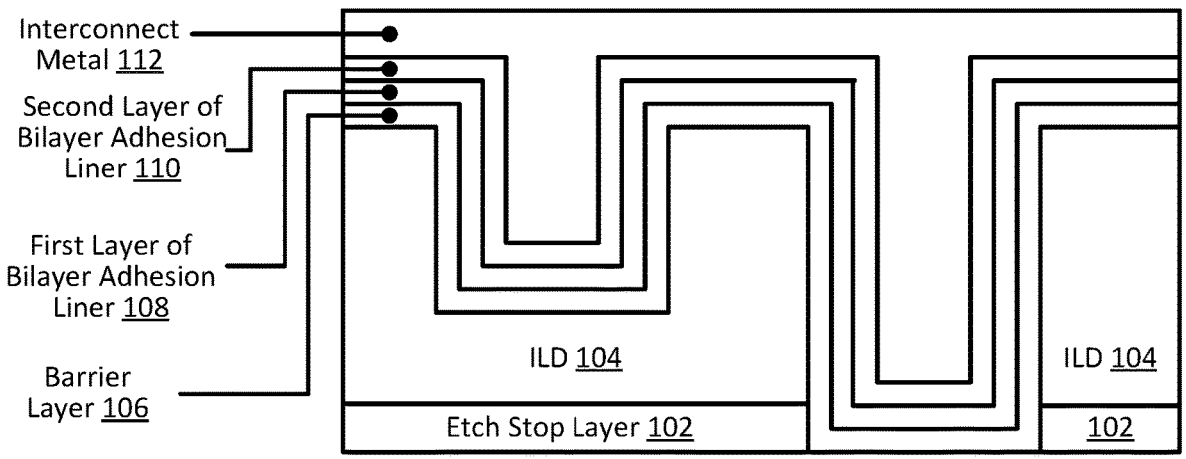
FIGS. 1A and 1B collectively illustrate cross-sectional views of example structures resulting during a cladding of metal interconnects with a bilayer adhesion liner process, in accordance with an embodiment of the present disclosure.

These and other features of the present embodiments will be understood better by reading the following detailed description, taken together with the figures herein described. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Techniques are disclosed for providing cladded metal interconnects. Given an interconnect trench, such as a line trench or a via trench, a barrier layer is conformally deposited onto the bottom and sidewalls of the trench. Then, a first layer of a bilayer adhesion layer or so-called liner is selectively deposited on the barrier layer, and a second layer of the bilayer adhesion liner is selectively deposited on the first layer. An interconnect metal, such as copper (Cu), is deposited into the trench above the bilayer adhesion liner to form a metal interconnect core. Similar to the deposition of the barrier layer and the bilayer adhesion liner, the deposition of the Cu may provide excess Cu outside of the trench. In such cases, any excess Cu, excess bilayer adhesion liner materials, and excess barrier layer material can be removed with planarization and/or polishing as needed to get the top surface of the Cu core to a proper plane. The exposed top surface of the Cu core in the trench is then capped with the bilayer adhesion liner (the first layer and the second layer of the bilayer adhesion liner) materials to provide a fully cladded Cu interconnect core. Subsequent processing can then be carried out (e.g., formation of a next interlayer dielectric layer, or a passivation layer, or an electronic device layer, or a contact layer, etc.). In other embodiments, the adhesion liner is a single layer liner and not a bilayer liner. In any such cases, as will be appreciated, the wetting property of the adhesion liner provides improved adhesion, which results in improved gap fill with the Cu, for instance. In addition, capping the top surface of the Cu interconnect core with the adhesion liner material prevents cap material depletion, thus providing improved electromigration (EM) reliability and performance.

General Overview

As previously explained, there are a number of non-trivial performance issues associated with the scaling of Cu interconnects to smaller device dimensions and feature sizes. For instance, the scaling of Cu interconnects present challenges for gap fill as well as increased demands for EM performance. One possible solution to increase EM reliability is to add dopants to the Cu seed layer before the electroplating of Cu. However, not all dopant atoms are consumed to enhance the adhesion of the top surface of the Cu interconnect core to the etch stop layer, and the residual percentage of the dopant that is not consumed results in a resistance penalty.

Thus, and in accordance with an embodiment of the present disclosure, interconnect structures are provided that include a cladded metal interconnect core, such as a fully cladded Cu interconnect core. In particular, a relatively thin adhesion layer is provided as a liner in an interconnect trench to clad the bottom and sides of the Cu interconnect core. The wetting property of the adhesion layer material provides good bonding of Cu atoms to the adhesion film, thus allowing for the formation of an ultrathin conformal Cu seed layer to form the Cu interconnect core. For example, the thin adhesion layer allows an ultrathin, pure Cu seed layer to be used to boost bottom-up nucleation and growth of the Cu interconnect core via electroplating, for instance. The use of an ultrathin Cu seed layer extends the use of Cu as an interconnect metal for feature sizes below 45 nm pitch, and smaller. The Cu interconnect core also reduces interconnect resistance, such as interconnect line resistance, that can result from using a copper alloy as the interconnect metal. In addition, the resulting adhesion (e.g., strong bonding) between the adhesion layer material and Cu interconnect core significantly reduces Cu diffusion along the Cu-adhesion layer material interface, thus mitigating EM risk. Further, capping the top surface of the Cu interconnect core with the adhesion layer material (i.e., capping the top surface of the Cu interconnect core with the same adhesion layer material used to clad the bottom and sides of the Cu interconnect core) significantly reduces, and in some instances eliminates, the risk of cap depletion at the top surface of the Cu interconnect core, since the same material is used in the all-around cladding of the Cu interconnect core. This, in turn, further minimizes EM risk by not exposing the top surface of the Cu interconnect core as may result from metal intermix (e.g., where a first material is used to clad the bottom and sides of the Cu interconnect core and a second material is used as a cap to clad the top surface of the Cu interconnect core). In some embodiments, a barrier layer is conformally formed on the bottom and sidewalls of the interconnect trench prior to forming the adhesion layer. In such cases, the barrier layer provides (serves as) a diffusion barrier that reduces, and in some instances prevents, later-formed metals of the interconnect feature, such as Cu, from diffusing into an underlying layer or substrate, such as an insulation layer in which the interconnect feature is formed.

In some embodiments, the adhesion layer is a bilayer liner composed of two materials (or elements). In such embodiments, the first layer of the bilayer adhesion liner includes Co, and the second layer of the bilayer adhesion liner includes at least one of ruthenium (Ru), osmium (Os), gold (Au), platinum (Pt), palladium (Pd), iridium (Ir), silver (Ag), rhodium (Rh), or another noble metal. In an example embodiment, the first layer material of the bilayer adhesion liner is Co, and the second layer material of the bilayer adhesion liner is Ru. In another example embodiment, the first layer material of the bilayer adhesion liner is Co, and the second layer material of the bilayer adhesion liner is Os. Alternatively, the first layer material and the second layer material can be flipped such that the first layer of the bilayer adhesion liner includes at least one of Ru, Os, Au, Pt, Pd, Ir, Ag, Rh, or another noble metal, and the second layer of the bilayer adhesion liner includes Co. In other embodiments, the adhesion layer is a single layer liner composed of a noble metal, such as Ru, Os, Au, Pt, Pd, Ir, Ag, and Rh, to provide some examples. That is, the single layer adhesion liner does not include the Co layer component of the bilayer adhesion liner described previously. In any such cases, the adhesion layer material or materials clad the bottom, sides, and top surfaces of the Cu interconnect core.

Use of the techniques and structures provided herein may be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate an integrated circuit or transistor device having cladded metal interconnects configured as described herein. For example, in some embodiments, such metal interconnects may be cladded with an bilayer adhesion liner between a barrier layer and the interconnect metal. In other embodiments, such metal interconnects may be cladded with an adhesion layer between a barrier layer and the interconnect metal. Further, such cladded metal interconnects may be identified by first identifying a metal interconnect structure including the all-around cladding using cross-sectional analysis (e.g., using SEM, TEM, or STEM through a transistor), for example, and then performing analysis for composition of the cladding material (e.g., using composition mapping) to identify that the cladding material includes one or more of the materials described herein. In some embodiments, the techniques described herein may be detected based on the benefits derived from their use, which include improved gap fill and EM reliability and performance as a result of the adhesion liner. Numerous configurations and variations will be apparent in light of this disclosure.

It is noted that designations such "above" or "below" or "top" or "bottom" or "top side" or "bottom side" are not intended to necessarily implicate a limitation as to orientation of the embodiments described herein. Rather, such terminology is simply used in a relative sense to consistently describe a structure as it exists in any one particular orientation and as illustrated herein.

System Architecture

Figure 1B:
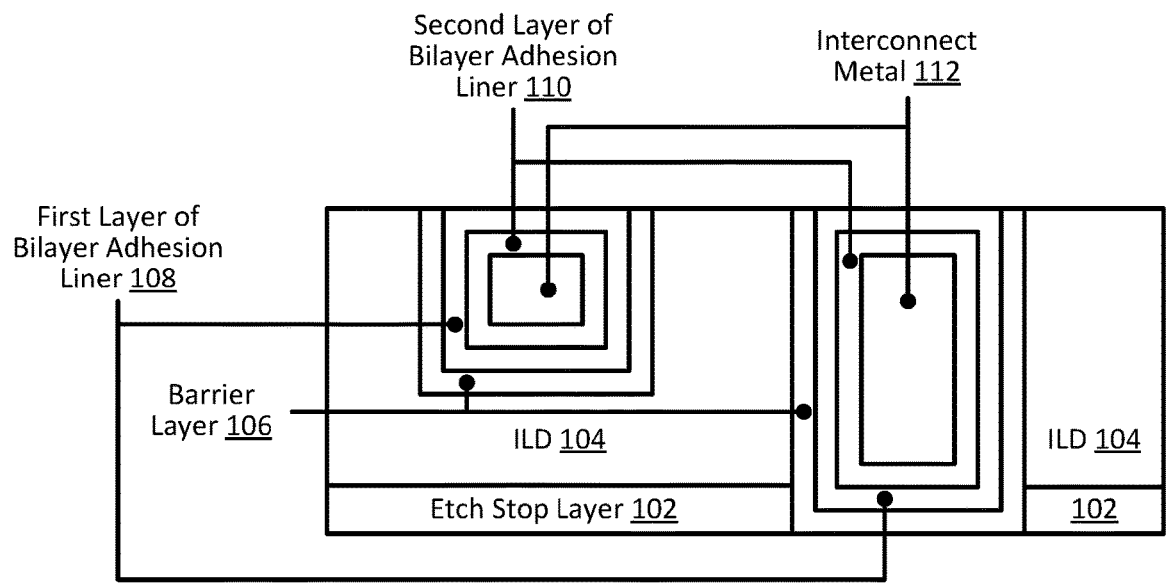

FIGS. 1A and 1B collectively illustrate cross-sectional views of example structures resulting during a cladding of metal interconnects with a bilayer adhesion liner process, in accordance with an embodiment of the present disclosure. In particular, FIG. 1A illustrates an intermediate structure that results after an interconnect metal 112 is deposited. As can be seen, the structure includes an interlayer dielectric (ILD) layer 104 provisioned on an etch stop layer 102. For instance, etch stop layer 102 may be provisioned on top of a lower metal. One or more interconnect trenches are subsequently etched into ILD layer 104. As can be seen in FIG. 1A, a via trench and a line trench are etched into ILD layer 104. Note that the via trench is etched into ILD layer 104 down to etch stop layer 102, so as to allow for a conductive interconnect from some upper metal layer to some lower metal layer. In contrast, the line trench is not etched into ILD layer 104 down to etch stop layer 102, but the etching of the line trench stops before reaching etch stop layer 102 so as to leave some of ILD layer 104 between the bottom surface of the line trench and etch stop layer 102. Although only two trenches are shown, any number of trenches can be provisioned. A barrier layer 106 is conformally deposited onto the bottom and sidewalls of the trenches. Note that the conformal deposition of barrier layer 106 results in the deposition of barrier layer 106 on ILD layer 104 outside of the trenches. Then, a first layer of bilayer adhesion liner 108 (interchangeably referred to herein as first layer 108) is selectively deposited onto barrier layer 106. A second layer of bilayer adhesion liner 110 (interchangeably referred to herein as second layer 110) is selectively deposited onto first layer 108. Then, an interconnect metal 112 is deposited into the trenches. Example materials that can be used for interconnect metal 112 include any suitably conductive metal, such as Cu. For instance, Cu interconnect metal can be electroplated as part of a Damascene or dual Damascene process. For example, a seed Cu layer, such as made from pure Cu, can be deposited (e.g., blanket deposited) onto second layer 110, and electroplating performed to fill the trenches with Cu.

As can be seen in FIG. 1A, deposition of interconnect metal 112 provides excess interconnect metal 112 outside of the trenches as well. As such, interconnect metal 112 is subsequently recessed so that interconnect metal 112 is not outside of the trenches. The extent of the recess of interconnect metal 112 into the trenches may vary from one embodiment to the next, but in some example cases the top surface of interconnect metal 112 in the trenches is even with or slightly below the top plane of ILD layer 104. For instance, a chemical-mechanical planarization or polishing (CMP) process can be used to recess interconnect metal 112. Recessing the top surface of interconnect metal 112 to be even with or slightly below the top plane of ILD layer 104 provides space above the top surface of interconnect metal 112 for forming a cap over interconnect metal 112. Also note that previously deposited second layer 110, first layer 108, and barrier layer 106 materials outside the trenches are removed along with the excess interconnect metal 112. Then, as can be seen in FIG. 1B, second layer 110 is selectively deposited onto interconnect metal 112 followed by a selective deposition of first layer 108 onto second layer 110, thereby capping the top surface of interconnect metal 112 with the same materials lining the trenches and cladding the bottom and sides of interconnect metal 112. In some embodiments, first layer 108 is selectively deposited onto interconnect metal 112 followed by a selective deposition of second layer 110 onto first layer 108, thereby capping the surface of interconnect metal 112. Note that in such example embodiments, the layering of the bilayer adhesion liner on the bottom and sidewalls of the trenches is the reverse of the layering of the bilayer adhesion liner of the cap. Subsequent processing can then be carried out, which may include, for example, deposition of another etch stop layer and ILD layer, or a passivation layer, or an electronic device layer, or a contact layer, to name a few examples.

First layer 108 and second layer 110 compose the two layers of the bilayer adhesion liner. First layer 108 reduces or minimizes the EM effects of interconnect metal 112 that is cladded by first layer 108. In some embodiments, first layer of bilayer adhesion liner 108 includes Co. Second layer 110 promotes adhesion of interconnect metal 112 to reduce interconnect metal 112 diffusion along the second layer 110-interconnect metal 112 interface, which further mitigates EM risk. Example materials that can be used for second layer of bilayer adhesion liner 110 include, for instance, Ru, Os, Au, Pt, Pd, Ir, Ag, Rh, and/or other suitable noble metal. In addition, capping the top surface of interconnect metal 112 with the same materials of the bilayer adhesion liner significantly reduces, and in some instances eliminates, the risk of cap depletion that may result from metal intermix between the cap material and the bilayer adhesion liner material, which also mitigates EM risk.

The respective thickness of first layer 108 and second layer 110 can vary from one embodiment to the next, but in some example configurations, first layer 108 and second layer 110 respectfully have a relatively uniform thickness in a range of about 1 nm to 3 nm, although other configurations may be thicker or thinner, depending on the desired electrical properties. Furthermore, the thickness need not be perfectly uniform and may vary depending on the deposition process used. A uniform deposition may have a small variance in thickness over the length of the layer, such as the thinnest part of the layer being within 10% of the thickest part of the layer, in accordance with an embodiment. Other embodiments may have a tighter tolerance on the layer thickness, such as a 5% or 2% tolerance between the thinnest and thickest parts.

Figure 2A:
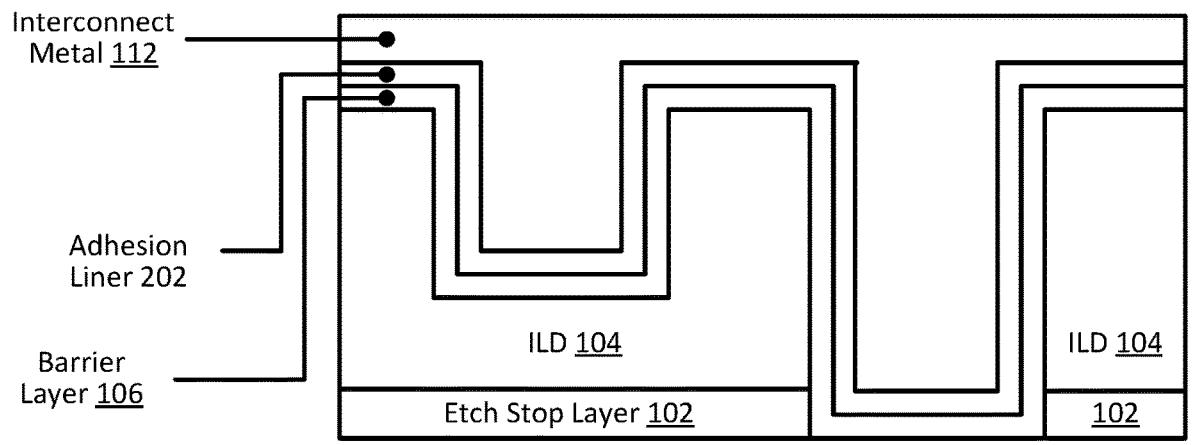
FIGS. 2A and 2B collectively illustrate cross-sectional views of example structures resulting during a cladding of metal interconnects with an adhesion liner process, in accordance with an embodiment of the present disclosure.
Figure 2B:
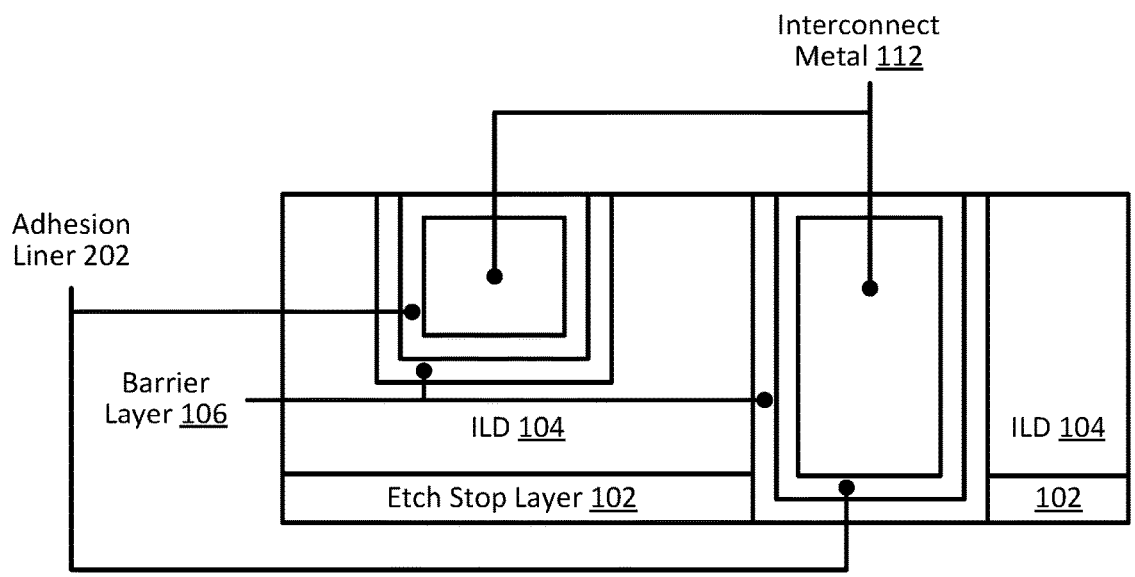

FIGS. 2A and 2B collectively illustrate cross-sectional views of example structures resulting during a cladding of metal interconnects with an adhesion liner process, in accordance with an embodiment of the present disclosure. FIGS. 2A and 2B illustrate structures similar to the example structure of FIGS. 1A and 1B. The previous relevant discussion with respect to features of FIGS. 1A and 1B that are similar to FIGS. 2A and 2B is equally applicable here, including the previous relevant discussion with respect to etch stop layer 102, ILD layer 104, barrier layer 106, and interconnect metal 112. Note that the relevant changes to the example structures of FIGS. 2A and 2B (compared to the example structures of FIGS. 1A and 1B) primarily relate to the structure and composition of the adhesion layer. Specifically, in the example structures of FIGS. 2A and 2B, the adhesion layer is a single layer liner as opposed to the bilayer liner in the structures of FIGS. 1A and 1B previously described.

As can be seen in FIG. 2A, an adhesion liner 202 is selectively deposited onto barrier layer 106. Then, interconnect metal 112 is deposited into the trenches. The deposition of interconnect metal 112 provides excess interconnect metal 112 outside of the trenches. As such, interconnect metal 112 is subsequently recessed so that interconnect metal 112 is only in the trenches and not outside of the trenches. Note that previously deposited excess adhesion liner 202 and barrier layer 106 materials outside the trenches are removed along with interconnect metal 112. Then, as can be seen in FIG. 2B, adhesion liner 202 is selectively deposited onto interconnect metal 112, thereby capping the top surface of interconnect metal 112 with the same material lining the trenches and cladding the bottom and sides of interconnect metal 112. Subsequent processing can then be carried out, which may include, for example, deposition of another etch stop layer and ILD layer, or a passivation layer, or an electronic device layer, or a contact layer, to name a few examples.

Adhesion liner 202 promotes adhesion of interconnect metal 112 to reduce interconnect metal 112 diffusion along the adhesion liner 202-interconnect metal 112 interface, which reduces or minimizes the EM effects of interconnect metal 112 that is cladded by adhesion liner 202. In addition, capping the top surface of interconnect metal 112 with the same material of adhesion liner 202 significantly reduces, and in some instances eliminates, the risk of cap depletion that may result from metal intermix between the cap material and the adhesion liner material, which further mitigates EM risk. Example materials that can be used for adhesion liner 202 include, for instance, Ru, Os, Au, Pt, Pd, Ir, Ag, Rh, and/or other suitable noble metal. The thickness of adhesion liner 202 can vary from one embodiment to the next, but in some example configurations, adhesion liner 202 has a relatively uniform thickness in a range of about 1 nm to 3 nm, although other configurations may be thicker or thinner, depending on the desired electrical properties. Note that similar to the layers of the bilayer adhesion liner discussed above in conjunction with FIGS. 1A and 1B, the thickness of adhesion liner 202 need not be perfectly uniform and may vary depending on the deposition process used. As will be appreciated, numerous configurations can be implemented and the present disclosure is not intended to be limited to any particular one.

Methodology

Figure 3:
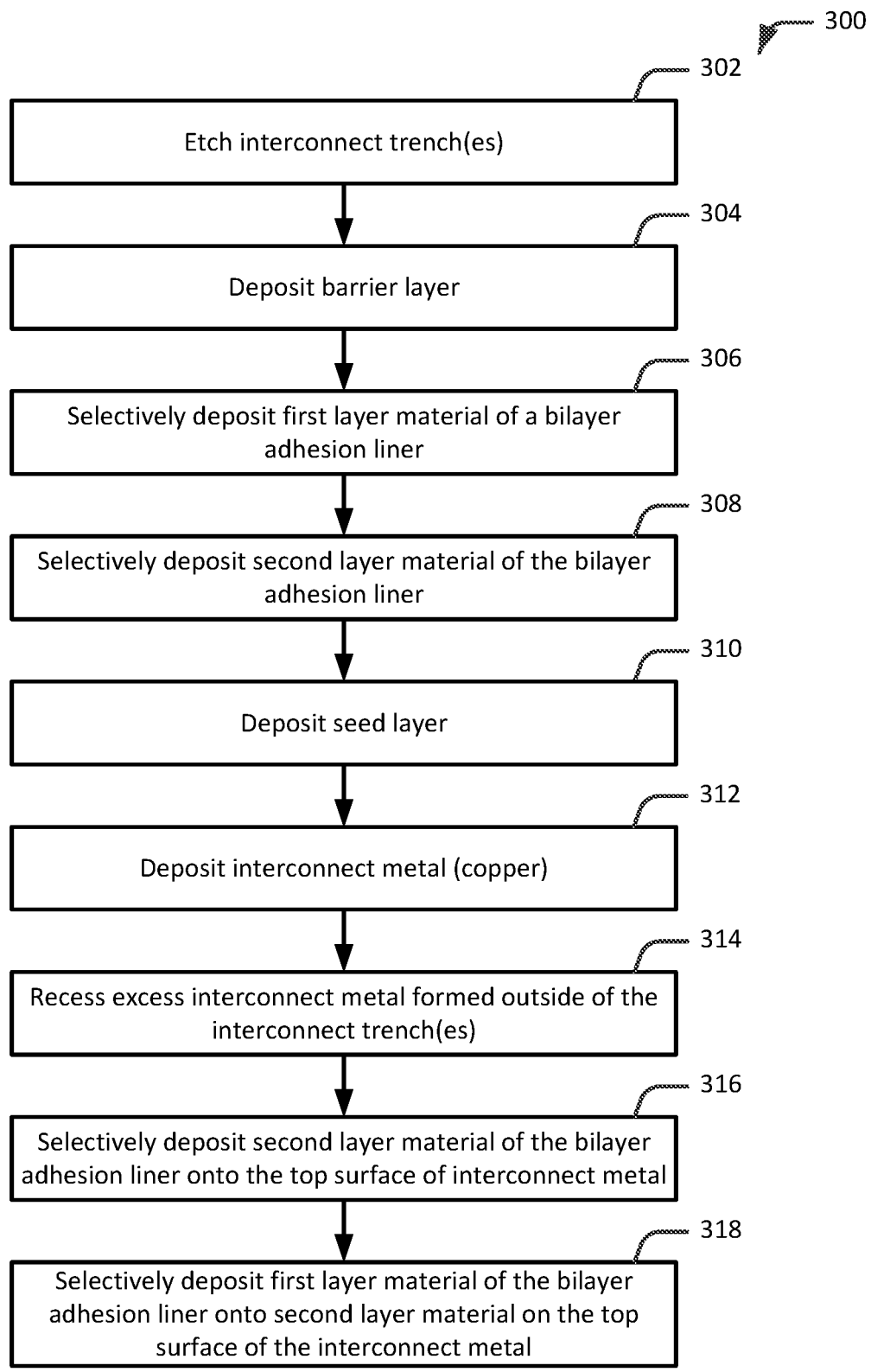
FIG. 3 is a flow diagram illustrating an example process for cladding a metal interconnect with a bilayer adhesion liner, in accordance with an embodiment of the present disclosure.

FIG. 3 is a flow diagram illustrating an example process 300 for cladding a metal interconnect with a bilayer adhesion liner, in accordance with an embodiment of the present disclosure. FIGS. 4A to 4H illustrate structures that are formed when carrying out process 300 of FIG. 3, in accordance with an embodiment of the present disclosure. Process 300 assumes an ILD structure for forming one or more metal interconnects therein. For example, the ILD structure may include an ILD layer provisioned on top of an etch stop layer. Process 300 also assumes Cu being the interconnect metal, and the use of a Damascene or dual Damascene process to fill the trenches with Cu. As will be further appreciated in light of this disclosure, for this and other processes and methods disclosed herein, the outlined actions and operations are only provided as examples, and some of the actions and operations may be optional, combined into fewer actions and operations, or expanded into additional actions and operations without detracting from the essence of the disclosed embodiments. Concurrent reference to FIG. 3 and FIGS. 4A-4G will facilitate explanation.

Figure 4A:
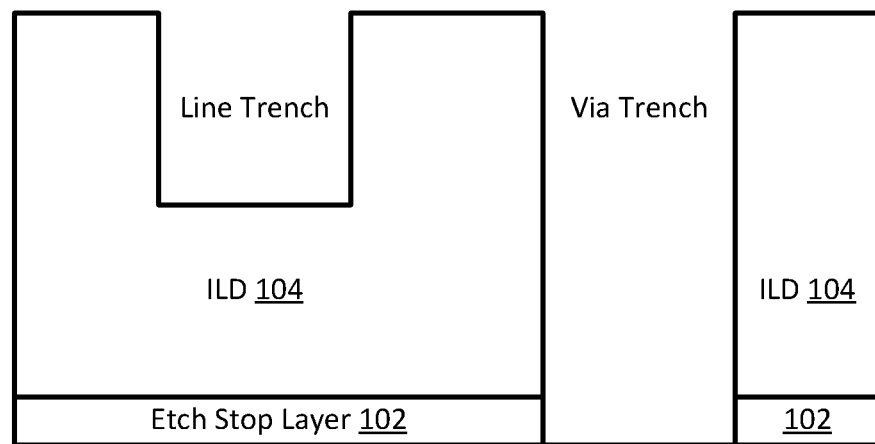
FIGS. 4A to 4H illustrate structures that are formed when carrying out the process of FIG. 3, in accordance with an embodiment of the present disclosure.

With reference to process 300 of FIG. 3, at block 302, one or more interconnect trenches are etched into the ILD layer, such as ILD layer 104. FIG. 4A illustrates an example of the resulting structure after formation of a line trench and a via trench etched into ILD layer 104 provisioned on top of etch stop layer 102. The trenches are for forming interconnect lines, vias, and/or other conductive interconnect features. Etch stop layer 102 can include any suitable material (e.g., a nitride material such as silicon nitride) to stop the etching of ILD layer 104 in forming one or more of the trenches. ILD layer 104 can include any suitable insulator material, such as an oxide or nitride (e.g., silicon dioxide), for example. The etch used to form the trenches can include any suitable techniques, such as various masking processes and wet and/or dry etching processes, for example. Note that the trenches may be formed with varying widths (dimension in the horizontal direction) and depths (dimension in the vertical direction) as can be understood based on this disclosure. For example, one or more hardmask patterning and etching processes may be performed to achieve varying depths in the trenches.

Figure 4B:
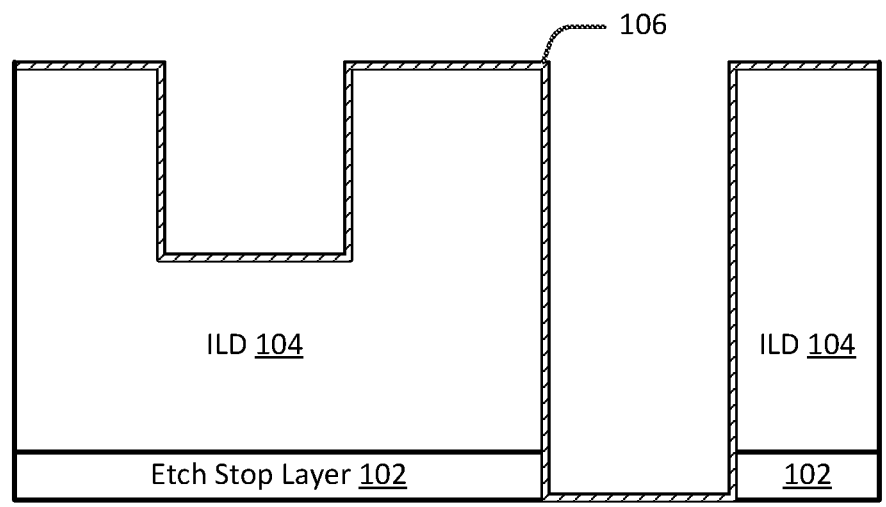

At block 304, a barrier layer, such as barrier layer 106, is conformally deposited onto the bottom and sidewalls of the trenches. FIG. 4B illustrates an example of the resulting structure after deposition of barrier layer 106 onto the bottom and sidewalls of the trenches. In some embodiments, deposition of barrier layer 106 may include any suitable deposition techniques, such as atomic layer deposition (ALD), chemical vapor deposition (CVD), physical vapor deposition (PVD), or any other suitable deposition process. Barrier layer 106 can include any suitable barrier material, such as tantalum or an alloy containing tantalum such as tantalum nitride, for example. Barrier layer 106 reduces or prevents unintended diffusion of the interconnect metal, such as Cu, into ILD layer 104 and other structures.

Figure 4C:
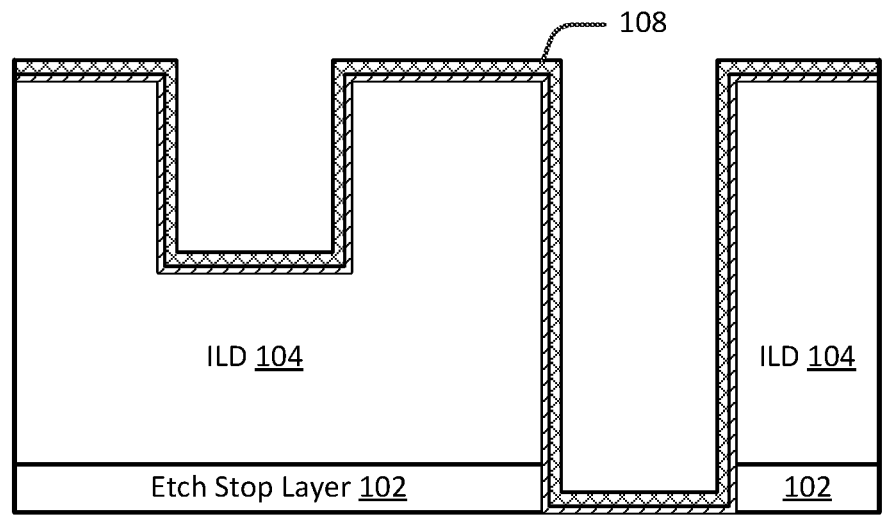

At block 306, a first layer material of a bilayer adhesion liner, such as first layer 108 material, is selectively deposited onto the barrier layer, such as barrier layer 106. FIG. 4C illustrates an example of the resulting structure after selective deposition of first layer 108 material onto barrier layer 106. In some embodiments, first layer 108 material includes Co. To selectively deposit the Co, barrier layer 106 can be pre-treated so that the Co film selectively grows only on barrier layer 106. The Co film reduces or minimizes the EM effects of the subsequently formed Cu interconnect core that is cladded by the Co film.

Figure 4D:
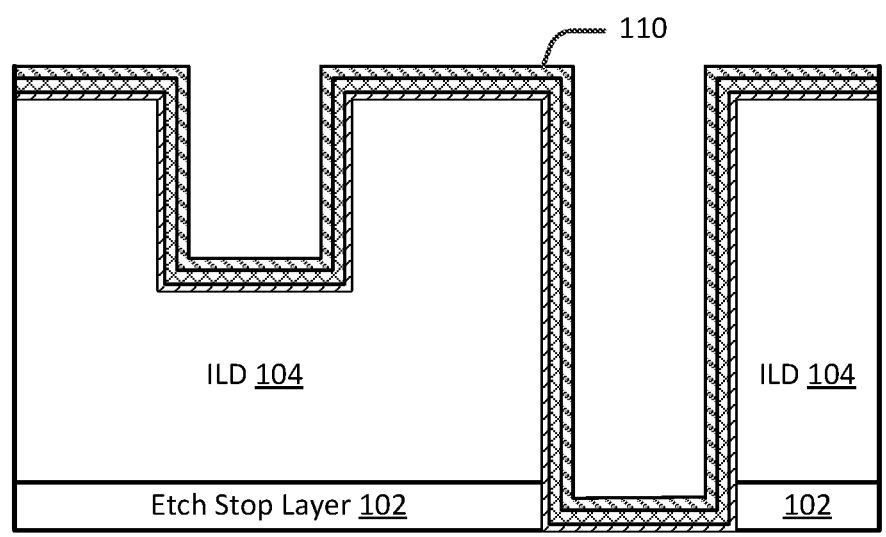

At block 308, a second layer material of the bilayer adhesion liner, such as second layer 110 material, is selectively deposited onto the first layer of the bilayer adhesion liner, such as first layer 108. FIG. 4D illustrates an example of the resulting structure after selective deposition of second layer 110 material onto first layer 108. In an example embodiment, second layer 110 material includes Ru. To selectively deposit the Ru, first layer 108 (e.g., the Co film) can be pre-treated so that the Ru film selectively grows only on first layer 108. The Ru film promotes adhesion of the subsequently formed Cu interconnect metal to the Ru film. The improved adhesion reduces diffusion of the Cu interconnect metal along the Ru film-Cu interconnect metal interface, which further mitigates EM risk. In addition, the Ru film provides for formation of an ultrathin conformal Cu seed layer for forming the Cu interconnect core. In other embodiments, second layer 110 material includes at least one of Os, Au, Pt, Pd, Ir, Ag, Rh, and/or other suitable noble metal. As described previously, the layering of the bilayer adhesion liner on the bottom and sidewalls of the trenches can be flipped or reversed where the second layer material of the bilayer adhesion liner is deposited before the first layer material of the adhesion liner, in some embodiments.

Figure 4E:
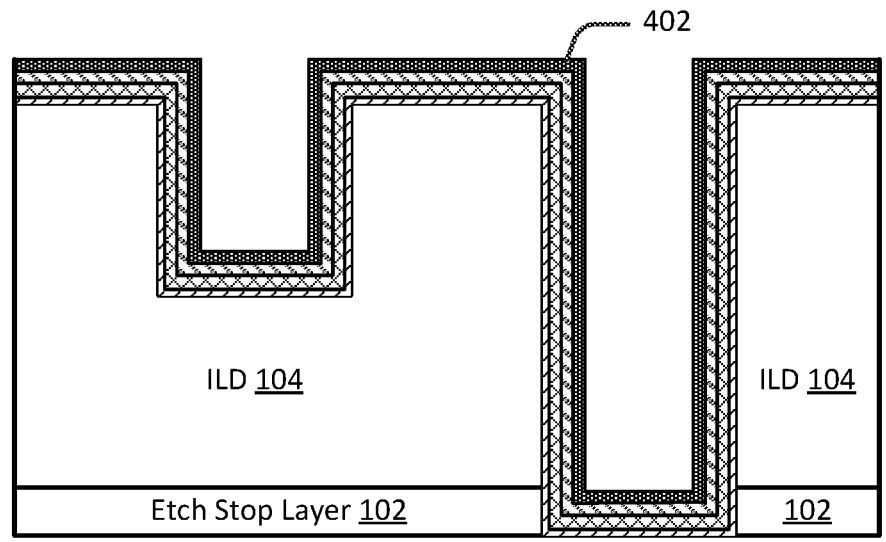

At block 310, a seed layer, such as a seed layer 402, is deposited onto the second layer of the bilayer adhesion liner, such as second layer 110. FIG. 4E illustrates an example of the resulting structure after deposition of seed layer 402 onto second layer 110. For instance, in the case of forming a Cu interconnect core, seed layer 402 is a Cu seed layer. The Cu seed layer is for subsequent electroplating and creation of a Cu interconnect core.

Figure 4F:
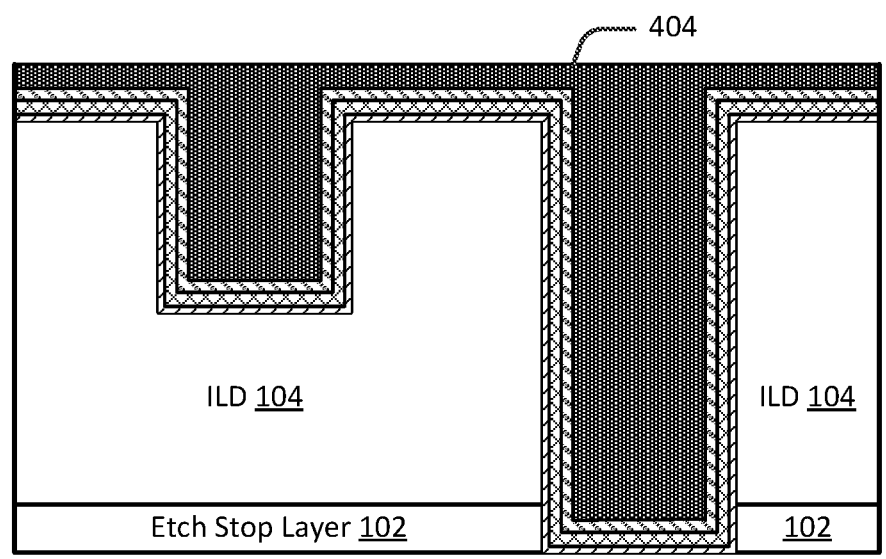

At block 312, an interconnect metal, such as a Cu interconnect metal 404, is deposited into the trenches. FIG. 4F illustrates an example of the resulting structure after deposition of Cu interconnect metal 404 into the trenches. Deposition of Cu interconnect metal 404 into the trenches may result in excess Cu interconnect metal 404 being formed on the surfaces outside of the trenches as well. In some embodiments, deposition of the Cu interconnect metal 404 may include any suitable deposition techniques, such as ALD, CVD, PVD, or any other suitable deposition process. Deposited Cu interconnect metal 404 subsequently forms the Cu interconnect core. Note that at this stage of process 300, the bottom and sides of the Cu interconnect core (e.g., the portions of Cu interconnect metal 404 in the trenches) are cladded with the bilayer adhesion liner.

Figure 4G:
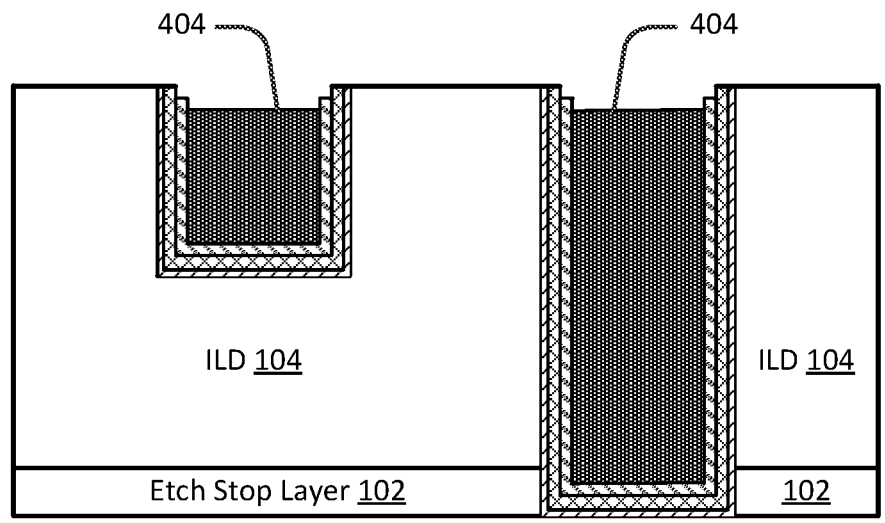

At block 314, the excess interconnect metal, such as Cu interconnect metal 404, formed outside of the trenches is recessed. FIG. 4G illustrates an example of the resulting structure after recessing the excess Cu interconnect metal 404 outside the trenches. In some embodiments, a CMP process can be used to recess Cu interconnect metal 404 to a proper plane (e.g., recess the top surface of Cu interconnect metal 404 to be slightly below the top plane of ILD 104). Note that previously deposited second layer 110, first layer 108, and barrier layer 106 materials outside the trenches are also removed with the excess Cu interconnect metal 404.

Figure 4H:
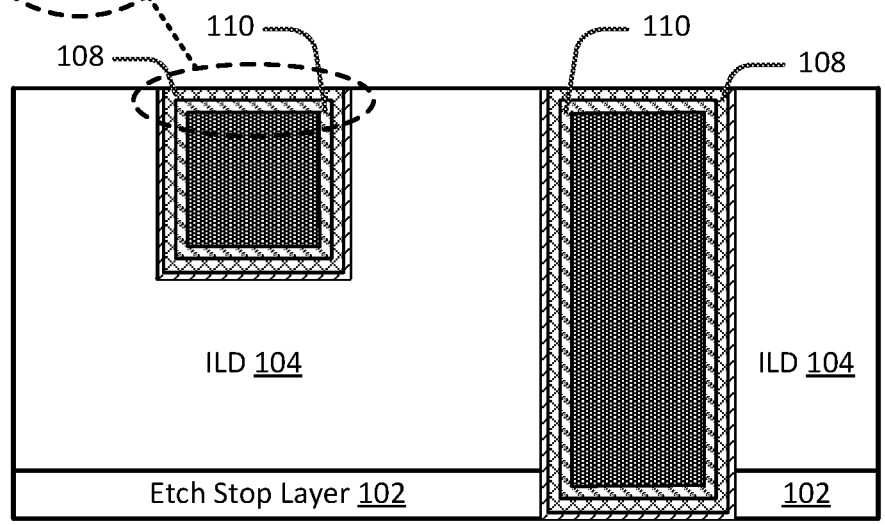

At block 316, the second layer material of the bilayer adhesion liner, such as second layer 110 material, is selectively deposited onto the top surface of the interconnect metal, such as Cu interconnect metal 404. To selectively deposit second layer 110 material, the top surface of Cu interconnect metal 404 can be pre-treated so that the second layer 110 material film selectively grows only on the top surface of Cu interconnect metal 404. At block 318, the first layer material of the bilayer adhesion liner, such as first layer 108 material, is selectively deposited onto the second layer material of the bilayer adhesion liner, such as first layer 110 material, cladding the top of the interconnect metal, such as Cu interconnect metal 404. To selectively deposit first layer 108 material, second layer 110 material on top of Cu interconnect metal 404 can be pre-treated so that the first layer 108 material film selectively grows only on the second layer 110 on top of Cu interconnect metal 404. FIG. 4H illustrates an example of the resulting structure after selective deposition of second layer 110 material and the selective deposition of first layer 108 material. Selective deposition of the second layer 110 and first layer 108 materials on the top surface of Cu interconnect metal 404 provides a cap over the top surface of Cu interconnect metal 404. FIG. 4H' illustrates a variation of the cap over the top surface of Cu interconnect metal 404, in accordance with an embodiment of the present disclosure. As can be seen, the second layer material of the bilayer adhesion liner is selectively deposited onto the top surface of the interconnect metal and the exposed sides of the bilayer adhesion liner in the trench, and the first layer material of the bilayer adhesion liner is selectively deposited onto the second layer material of the bilayer adhesion liner. As described previously, the first layer material of the bilayer adhesion liner can be selectively deposited onto the top surface of the interconnect metal and the exposed sides of the bilayer adhesion liner in the trench, and the second layer material of the bilayer adhesion liner selectively deposited onto the first layer material of the bilayer adhesion liner, in some embodiments. Note that at this stage of process 300, the Cu interconnect core (e.g., the portions of Cu interconnect metal 404 in the trenches) is fully cladded with the bilayer adhesion liner. Cladding all sides of the Cu interconnect core with the same material (e.g., bilayer adhesion liner materials) further mitigates EM risk.

Figure 5:
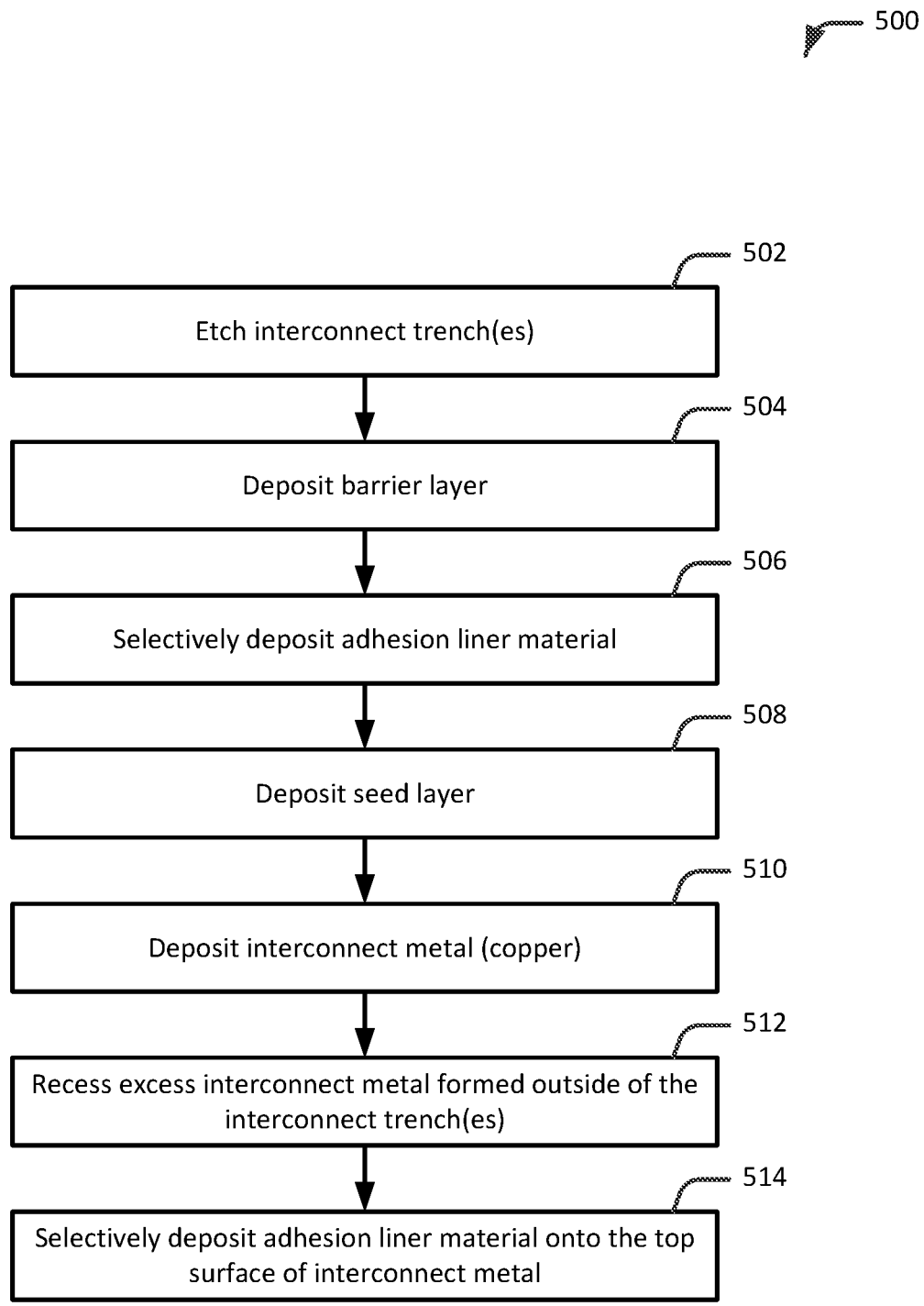
FIG. 5 is a flow diagram illustrating an example process for cladding a metal interconnect with an adhesion liner, in accordance with an embodiment of the present disclosure.

FIG. 5 is a flow diagram illustrating an example process 500 for cladding a metal interconnect with an adhesion liner, in accordance with an embodiment of the present disclosure. FIGS. 6A to 6G illustrate structures that are formed when carrying out process 500 of FIG. 5, in accordance with an embodiment of the present disclosure. Concurrent reference to FIG. 5 and FIGS. 6A-6G will facilitate explanation.

Figure 6A:
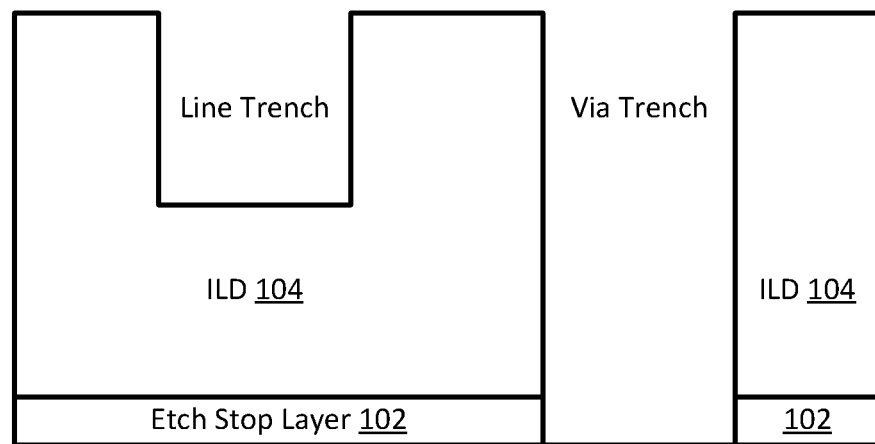
FIGS. 6A to 6G illustrate structures that are formed when carrying out the process of FIG. 5, in accordance with an embodiment of the present disclosure.
Figure 6B:
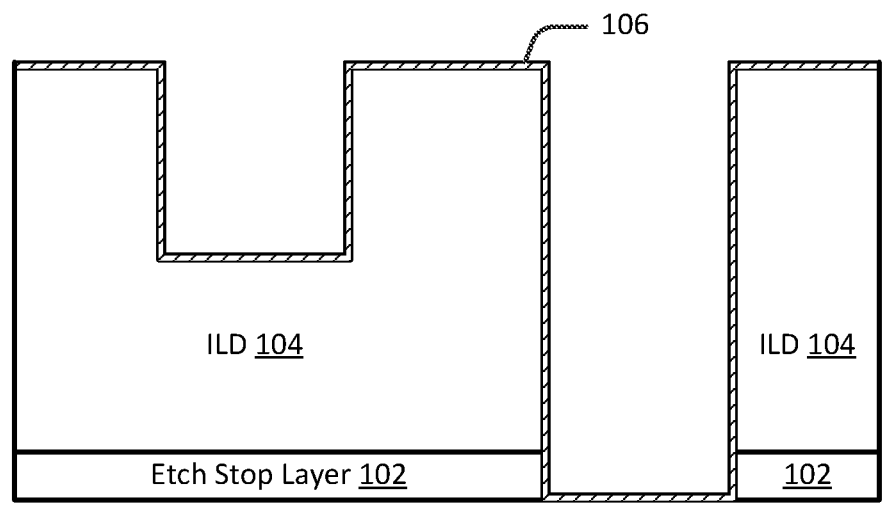

With reference to process 500 of FIG. 5, at block 502, one or more interconnect trenches are etched into the ILD layer, such as ILD layer 104. FIG. 6A illustrates an example of the resulting structure after formation of a line trench (the left trench) and a via trench (the right trench) etched into ILD layer 104 provisioned on top of etch stop layer 102. At block 504, a barrier layer, such as barrier layer 106, is conformally deposited onto the bottom and sidewalls of the trenches. FIG. 6B illustrates an example of the resulting structure after deposition of barrier layer 106 onto the bottom and sidewalls of the trenches. The operations of blocks 502 and 504 are substantially similar to the operations of blocks 302 and 304, respectfully, previously described, and that relevant discussion is equally applicable here.

Figure 6C:
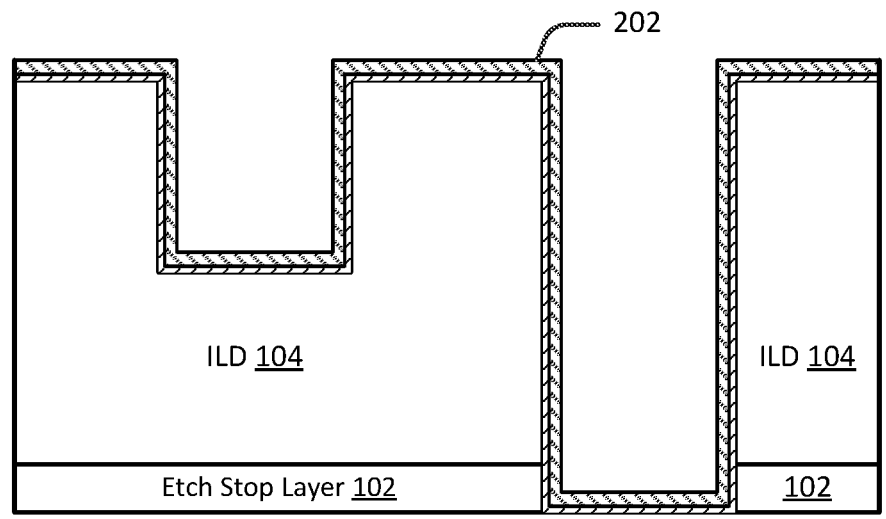

At block 506, an adhesion liner material, such as adhesion liner 202 material, is selectively deposited onto the barrier layer, such as barrier layer 106. FIG. 6C illustrates an example of the resulting structure after selective deposition of adhesion liner 202 material onto barrier layer 106. In some embodiments, adhesion liner 202 material includes Ru. To selectively deposit the Ru, barrier layer 106 can be pre-treated so that the Ru film selectively grows only on barrier layer 106. The Ru film promotes adhesion of the subsequently formed Cu interconnect metal to the Ru film. The improved adhesion reduces diffusion of the Cu interconnect metal along the Ru film-Cu interconnect metal interface, which reduces or minimizes the EM effects of the subsequently formed Cu interconnect core that is cladded by the Ru film. In addition, the Ru film provides for formation of an ultrathin conformal Cu seed layer for forming the Cu interconnect core. In other embodiments, adhesion liner 202 material includes at least one of Os, Au, Pt, Pd, Ir, Ag, Rh, and/or other suitable noble metal.

Figure 6D:
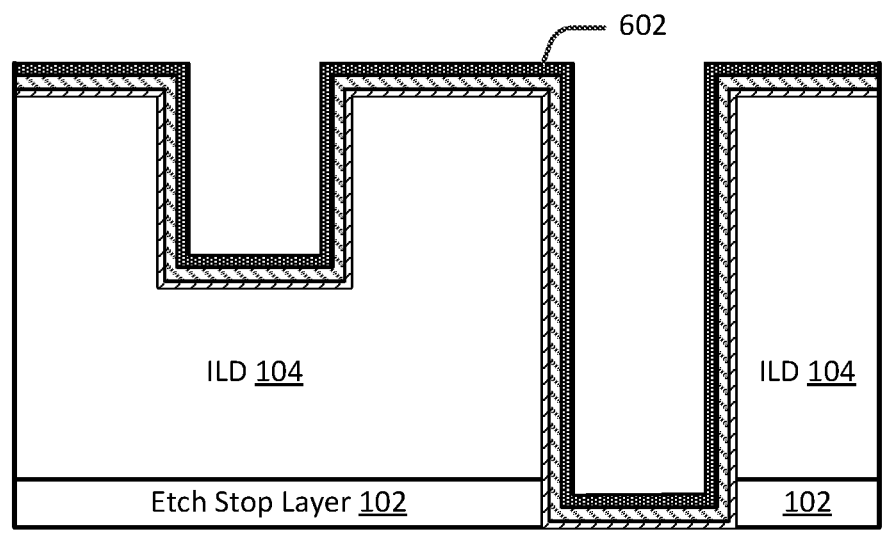
Figure 6E:
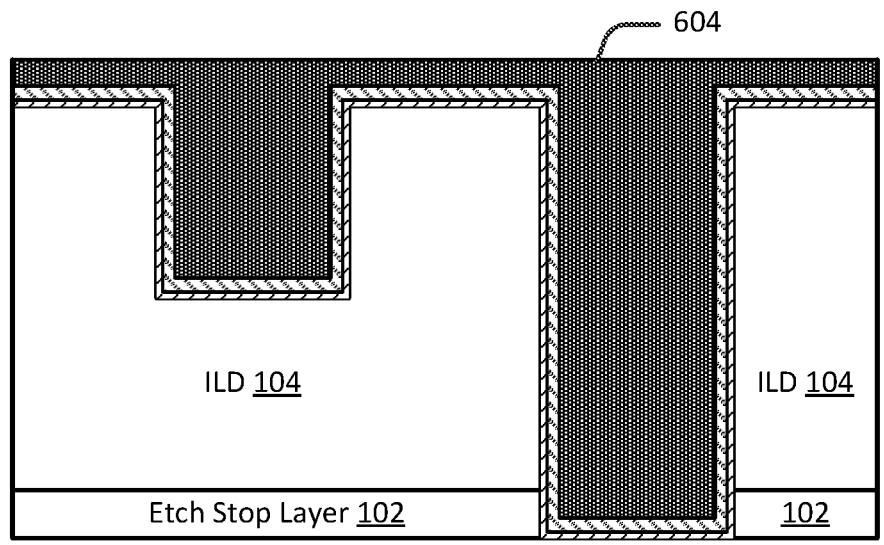

At block 508, a seed layer, such as a seed layer 602, is deposited onto the adhesion liner, such as adhesion liner 202. FIG. 6D illustrates an example of the resulting structure after deposition of seed layer 602 onto adhesion liner 202. At block 510, an interconnect metal, such as a Cu interconnect metal 604, is deposited into the trenches. FIG. 6E illustrates an example of the resulting structure after deposition of Cu interconnect metal 604 into the trenches. The operations of blocks 508 and 510 are substantially similar to the operations of blocks 310 and 312, respectfully, previously described, and that relevant discussion is equally applicable here. Note that at this stage of process 500, the bottom and sides of the Cu interconnect core (e.g., the portions of Cu interconnect metal 604 in the trenches) are cladded with the adhesion liner.

Figure 6F:
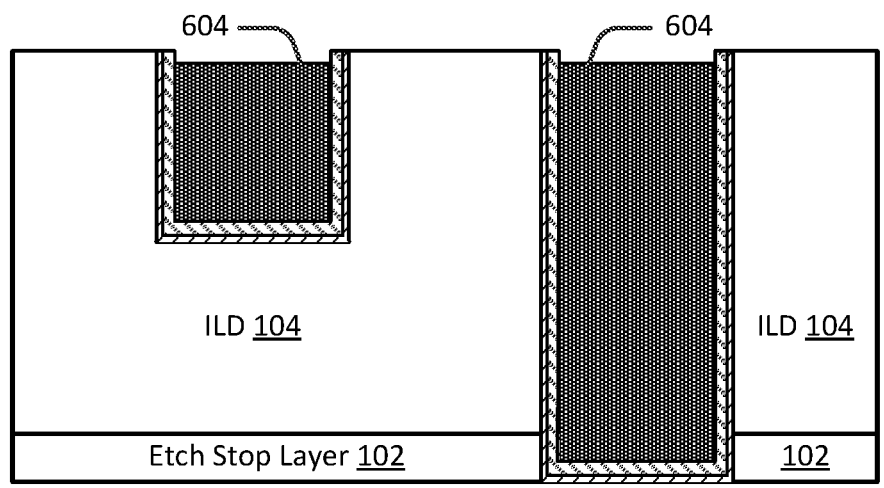

At block 512, the excess interconnect metal, such as Cu interconnect metal 604, formed outside of the trenches is recessed. FIG. 6F illustrates an example of the resulting structure after recessing the excess Cu interconnect metal 604 outside the trenches. In some embodiments, a CMP process can be used to recess Cu interconnect metal 604 to a proper plane (e.g., recess the top surface of Cu interconnect metal 604 to be slightly below the top plane of ILD 104). Note that previously deposited adhesion liner 202 and barrier layer 106 materials outside the trenches are also removed with the excess Cu interconnect metal 604.

Figure 6G:
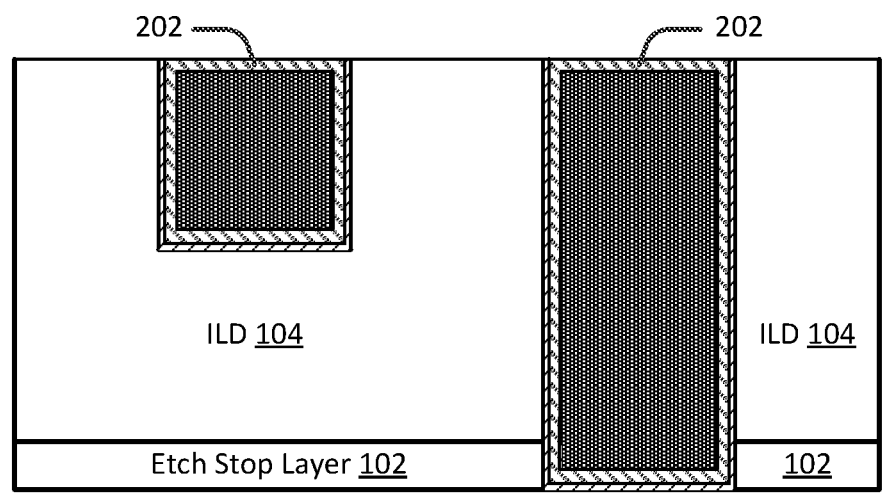

At block 514, the adhesion liner material, such as adhesion liner 202 material, is selectively deposited onto the top surface of the interconnect metal, such as Cu interconnect metal 604. FIG. 6G illustrates an example of the resulting structure after selective deposition of adhesion liner 202 material onto the top surface of CU interconnect metal 604. To selectively deposit adhesion liner 202 material, the top surface of Cu interconnect metal 604 can be pre-treated so that the adhesion liner 202 material film selectively grows only on the top surface of Cu interconnect metal 604. Selective deposition of the adhesion liner 202 material on the top surface of Cu interconnect metal 604 provides a cap over the top surface of Cu interconnect metal 604. Note that at this stage of process 500, the Cu interconnect core (e.g., the portions of Cu interconnect metal 604 in the trenches) is fully cladded with the adhesion liner. Cladding all sides of the Cu interconnect core with the same material (e.g., adhesion liner material) further mitigates EM risk.

Example System

Figure 7:
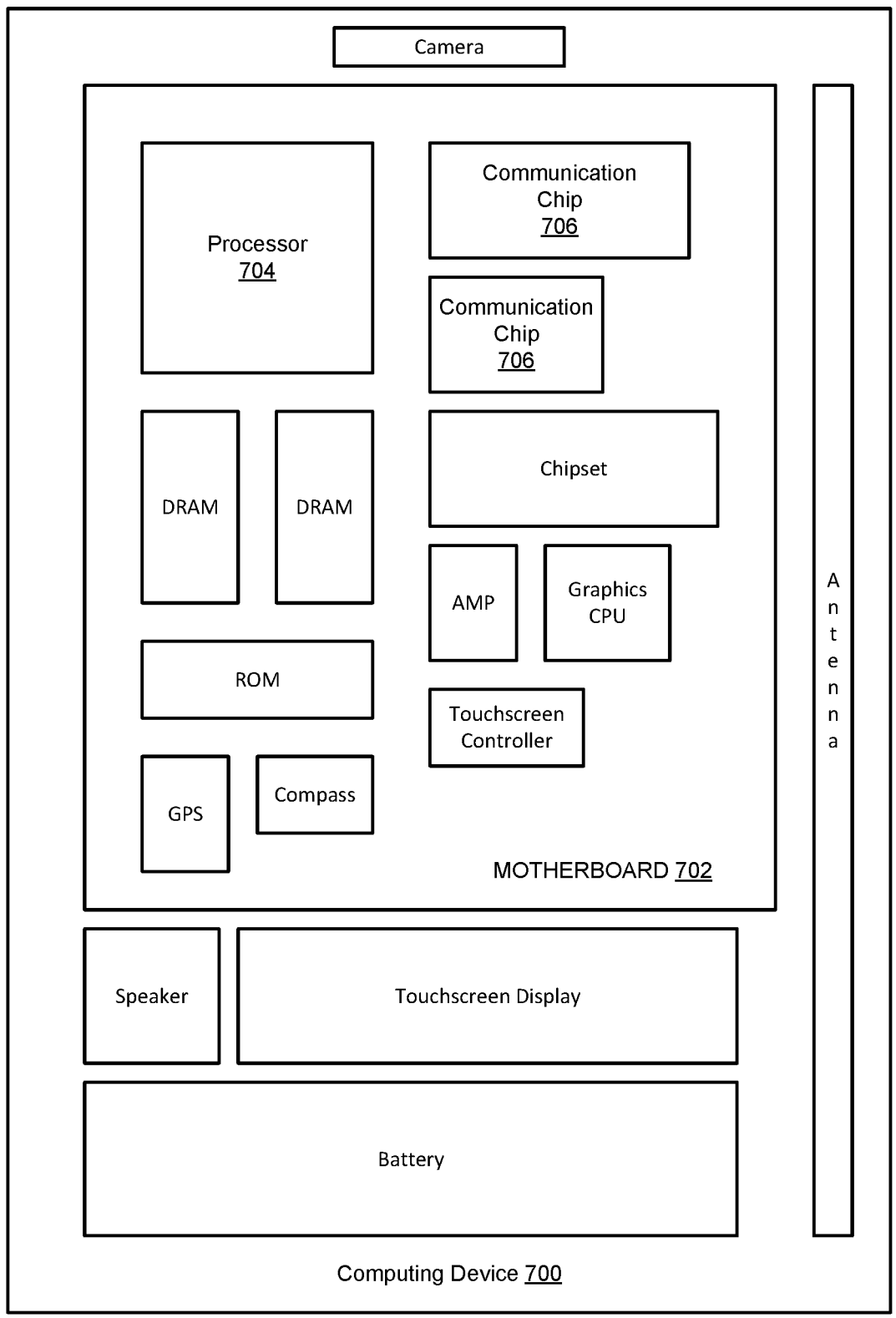
FIG. 7 is an example computing system implemented with one or more of the integrated circuit structures as disclosed herein, in accordance with an embodiment of the present disclosure.

FIG. 7 is an example computing system 700 implemented with one or more of the integrated circuit structures as disclosed herein, in accordance with an embodiment of the present disclosure. As can be seen, computing system 700 houses a motherboard 702. Motherboard 702 may include a number of components, including, but not limited to, a processor 704 and at least one communication chip 706, each of which can be physically and electrically coupled to motherboard 702, or otherwise integrated therein. As will be appreciated, motherboard 702 may be, for example, any printed circuit board, whether a main board, a daughterboard mounted on a main board, or the only board of system 700, etc.

Depending on its applications, computing system 700 may include one or more other components that may or may not be physically and electrically coupled to motherboard 702. These other components may include, but are not limited to, volatile memory (e.g., DRAM), non-volatile memory (e.g., read only memory (ROM)), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 700 may include one or more integrated circuit structures or devices configured in accordance with an example embodiment (e.g., to include one or more semiconductor structures including a cladded metal interconnect, as variously provided herein). In some embodiments, multiple functions can be integrated into one or more chips (e.g., for instance, note that communication chip 706 can be part of or otherwise integrated into processor 704).

Communication chip 706 enables wireless communications for the transfer of data to and from computing system 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 706 may implement any of a number of wireless standards or protocols, including, but not limited to, Wi-Fi (Institute of Electrical and Electronics Engineers (IEEE) 802.11 family), worldwide interoperability for microwave access (WiMAX) (IEEE 802.16 family), IEEE 802.20, long term evolution (LTE), 1x evolution-data optimized (Ev-DO), high speed packet access (HSPA+), high speed downlink packet access (HSDPA+), high speed uplink packet access (HSUPA+), enhanced data rates for GSM evolution (EDGE), global system for mobile communication (GSM), general packet radio service (GPRS), code division multiple access (CDMA), time division multiple access (TDMA), digital enhanced cordless telecommunications (DECT), Bluetooth, derivatives thereof, as well as any other wireless protocols that are designated as 3G, 4G, 5G, and beyond. Computing system 700 may include multiple communication chips 706. For instance, a first communication chip 706 may be dedicated to shorter range wireless communications such as Wi-Fi and Bluetooth, and a second communication chip 706 may be dedicated to longer range wireless communications such as GPS, EDGE, GPRS, CDMA, WiMAX, LTE, Ev-DO, and others. In some embodiments, communication chip 706 may include one or more semiconductor structures including cladded metal interconnects, as variously described herein.

Processor 704 of computing system 700 includes an integrated circuit die packaged within processor 704. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

Communication chip 706 also may include an integrated circuit die packaged within communication chip 706. In accordance with some such example embodiments, the integrated circuit die of the communication chip includes one or more integrated circuit structures or devices formed using the disclosed techniques, as variously described herein. As will be appreciated in light of this disclosure, note that multi-standard wireless capability may be integrated directly into processor 704 (e.g., where functionality of any chips 706 is integrated into processor 704, rather than having separate communication chips). Further note that processor 704 may be a chip set having such wireless capability. In short, any number of processor 704 and/or communication chips 706 can be used. Likewise, any one chip or chip set can have multiple functions integrated therein.

In various implementations, computing system 700 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 includes an integrated circuit device including: an interlayer dielectric (ILD) layer having an interconnect trench therein, the interconnect trench having sidewalls and a bottom; a first layer on the sidewalls and the bottom of the interconnect trench; a second layer on the first layer, the second layer including an adhesion layer material; a metal interconnect core on the second layer in the interconnect trench, wherein the second layer dads the metal interconnect core in the interconnect trench; and a cap on a top surface of the metal interconnect core, the cap including a cap material, wherein the cap material is the same as the second layer material.

Example 2 includes the subject matter of Example 1, wherein the metal interconnect core includes copper (Cu).

Example 3 includes the subject matter of any of Examples 1 and 2, wherein the second layer material includes at least one of ruthenium (Ru), osmium (Os), gold (Au), platinum (Pt), palladium (Pd), iridium (Ir), silver (Ag), and rhodium (Rh).

Example 4 includes the subject matter of any of Examples 1 through 3, wherein the second layer has a thickness in a range of 1 nm to 3 nm.

Example 5 includes the subject matter of any of Examples 1 through 4, wherein a thickness of the second layer is uniform, such that a thinnest part of the second layer is within 5% of a thickest part of the second layer.

Example 6 includes the subject matter of any of Examples 1 through 5, wherein the first layer provides a diffusion barrier material that prevents the metal interconnect core from diffusing into the ILD layer.

Example 7 includes the subject matter of any of Examples 1 through 6, wherein the second layer provides for formation of a conformal seed layer.

Example 8 includes the subject matter of any of Examples 1 through 7, wherein the second layer reduces metal diffusion along the interface between the metal interconnect core and the second layer.

Example 9 includes the subject matter of any of Examples 1 through 8, wherein the second layer is a bilayer structure including a third layer and a fourth layer.

Example 10 includes the subject matter of Example 9, wherein the third layer includes cobalt (Co).

Example 11 includes the subject matter of any of Examples 9 and 10, wherein the fourth layer includes at least one of Ru, Os, Au, Pt, Pd, Ir, Ag, and Rh.

Example 12 includes the subject matter of any of Examples 9 through 11, wherein the third layer has a thickness in a range of 1 nm to 3 nm.

Example 13 includes the subject matter of any of Examples 9 through 12, wherein the fourth layer has a thickness in a range of 1 nm to 3 nm.

Example 14 includes the subject matter of any of Examples 9 through 13, wherein a thickness of the third layer and a thickness of the fourth layer are uniform, such that a thinnest part of each layer is within 5% of a thickest part of each layer.

Example 15 includes an integrated circuit device including: an interlayer dielectric (ILD) layer having an interconnect trench therein, the interconnect trench having sidewalls and a bottom; a first layer on the sidewalls and the bottom of the interconnect trench; a second layer on the first layer, the second layer including an adhesion layer material; a copper (Cu) interconnect core on the second layer in the interconnect trench, wherein the second layer dads the Cu interconnect core in the interconnect trench; and a cap on a top surface of the Cu interconnect core, the cap including a cap material, wherein the cap material is the same as the second layer material, thereby cladding the top surface of the Cu interconnect core with the second layer material.

Example 16 includes the subject matter of Example 15, wherein the second layer provides for formation of a conformal Cu seed layer.

Example 17 includes the subject matter of any of Examples 15 and 16, wherein the second layer reduces Cu diffusion along the interface between the Cu interconnect core and the second layer.

Example 18 includes the subject matter of any of Examples 15 through 17, wherein the second layer material includes at least one of ruthenium (Ru), osmium (Os), gold (Au), platinum (Pt), palladium (Pd), iridium (Ir), silver (Ag), and rhodium (Rh).

Example 19 includes the subject matter of any of Examples 15 through 18, wherein the second layer has a thickness in a range of 1 nm to 3 nm.

Example 20 includes the subject matter of any of Examples 17 through 19, wherein a thickness of the second layer is uniform, such that a thinnest part of the second layer is within 5% of a thickest part of the second layer.

Example 21 includes the subject matter of any of Examples 17 through 20, wherein the first layer provides a diffusion barrier material that prevents the Cu interconnect core from diffusing into the ILD layer.

Example 22 includes the subject matter of any of Examples 17 through 21, wherein the second layer is a bilayer structure including a third layer and a fourth layer.

Example 23 includes the subject matter of Example 22, wherein the third layer includes cobalt (Co), and the fourth layer includes at least one of Ru, Os, Au, Pt, Pd, Ir, Ag, and Rh.

Example 24 includes the subject matter of any of Examples 22 and 23, wherein the third layer and the fourth layer each have a thickness in a range of 1 nm to 3 nm.

Example 25 includes the subject matter of any of Examples 22 through 24, wherein a thickness of the third layer and a thickness of the fourth layer are uniform, such that a thinnest part of each layer is within 5% of a thickest part of each layer.

Example 26 includes a method for forming a cladded metal interconnect structure, the method including: forming an interlayer dielectric (ILD) layer having an interconnect trench therein, the interconnect trench having sidewalls and a bottom; conformally depositing a conformal first layer on the sidewalls and the bottom of the interconnect trench; selectively depositing a second layer on the conformal first layer, the second layer including an adhesion layer material; depositing an interconnect metal in the interconnect trench such that the second layer dads the interconnect metal in the interconnect trench; and selectively depositing a cap on a top surface of the interconnect metal, the cap including a cap material, wherein the cap material is the same as the second layer material.

Example 27 includes the subject matter of Example 26, further including at least one of: depositing a seed layer onto the second layer; and recessing excess interconnect metal formed outside the trench.

Example 28 includes the subject matter of any of Examples 26 and 27, wherein the metal interconnect core includes copper (Cu).

Example 29 includes the subject matter of any of Examples 26 through 28, wherein the second layer material includes at least one of ruthenium (Ru), osmium (Os), gold (Au), platinum (Pt), palladium (Pd), iridium (Ir), silver (Ag), and rhodium (Rh).

Example 30 includes the subject matter of any of Examples 26 through 29, wherein the adhesion layer has a thickness in a range of 1 nm to 3 nm.

Example 31 includes the subject matter of any of Examples 26 through 30, wherein a thickness of the second layer is uniform, such that a thinnest part of the second layer is within 5% of a thickest part of the second layer.

Example 32 includes the subject matter of any of Examples 26 through 31, wherein the first layer provides a diffusion barrier material that prevents the metal interconnect core from diffusing into the ILD layer.

Example 33 includes the subject matter of any of Examples 26 through 32, wherein the second layer provides for formation of a conformal seed layer.

Example 34 includes the subject matter of any of Examples 26 through 33, wherein the second layer reduces metal diffusion along the interface between the metal interconnect core and the second layer.

Example 35 includes the subject matter of any of Examples 26 through 34, wherein the second layer is a bilayer structure including a third layer and a fourth layer.

Example 36 includes the subject matter of Example 35, wherein the third layer includes cobalt (Co).

Example 37 includes the subject matter of any of Examples 35 and 36, wherein the fourth layer includes at least one of Ru, Os, Au, Pt, Pd, 1r, Ag, and Rh.

Example 38 includes the subject matter of any of Examples 35 through 37, wherein the third layer has a thickness in a range of 1 nm to 3 nm.

Example 39 includes the subject matter of any of Examples 35 through 38, wherein the fourth layer has a thickness in a range of 1 nm to 3 nm.

Example 40 includes the subject matter of any of Examples 35 through 39, wherein a thickness of the third layer is uniform, such that a thinnest part of the third layer is within 5% of a thickest part of the third layer.

Example 41 includes the subject matter of any of Examples 35 through 40, wherein a thickness of the fourth layer is uniform, such that a thinnest part of the fourth layer is within 5% of a thickest part of the fourth layer.

All examples and conditional language recited in the present disclosure are intended for pedagogical objects to aid the reader in understanding the present disclosure and the concepts contributed by the inventor to furthering the art, and are to be construed as being without limitation to such specifically recited examples and conditions. Although embodiments of the present disclosure have been described in detail, various changes, substitutions, and alterations could be made hereto without departing from the spirit and scope of the present disclosure. Accordingly, it is intended that the scope of the present disclosure be limited not by this detailed description, but rather by the claims appended hereto.

What is claimed is:

1. An integrated circuit device comprising:
   an interlayer dielectric (ILD) layer having an interconnect trench therein, the interconnect trench having sidewalls and a bottom;
   a first layer on the sidewalls and the bottom of the interconnect trench;
   a second layer on the first layer, the second layer including an adhesion layer material, wherein the second layer material includes at least one of osmium (Os), gold (Au), platinum (Pt), palladium (Pd), iridium (Ir), silver (Ag), and rhodium (Rh);
   a metal interconnect core on the second layer in the interconnect trench, wherein the second layer clads the metal interconnect core in the interconnect trench; and
   a cap on a top surface of the metal interconnect core, the cap including a cap material, wherein the cap material is the same as the second layer material, wherein the cap has a bottommost surface below an uppermost surface of the ILD layer, the bottommost surface of the cap below an uppermost surface of the first layer, and wherein the cap is over an uppermost surface of the second layer.

2. The integrated circuit device of claim 1, wherein the metal interconnect core includes copper (Cu).

3. The integrated circuit device of claim 1, wherein the second layer has a thickness in a range of 1 nm to 3 nm.

4. The integrated circuit device of claim 1, wherein a thickness of the second layer is uniform, such that a thinnest part of the second layer is within 5% of a thickest part of the second layer.

5. The integrated circuit device of claim 1, wherein the first layer provides a diffusion barrier material that prevents the metal interconnect core from diffusing into the ILD layer.

6. The integrated circuit device of claim 1, wherein the second layer provides for formation of a conformal seed layer.

7. The integrated circuit device of claim 1, wherein the second layer reduces metal diffusion along the interface between the metal interconnect core and the second layer.

8. The integrated circuit device of claim 1, wherein the second layer is a bilayer structure including a third layer and a fourth layer.

9. The integrated circuit device of claim 8, wherein the third layer has a thickness in a range of 1 nm to 3 nm.

10. The integrated circuit device of claim 8, wherein the fourth layer has a thickness in a range of 1 nm to 3 nm.

11. The integrated circuit device of claim 8, wherein a thickness of the third layer and a thickness of the fourth layer are uniform, such that a thinnest part of each layer is within 5% of a thickest part of each layer.

12. An integrated circuit device comprising:
    an interlayer dielectric (ILD) layer having an interconnect trench therein, the interconnect trench having sidewalls and a bottom;
    a first layer on the sidewalls and the bottom of the interconnect trench;
    a second layer on the first layer, the second layer including an adhesion layer material; wherein the second layer material includes at least one of osmium (Os), gold (Au), platinum (Pt), palladium (Pd), iridium (Ir), silver (Ag), and rhodium (Rh);
    a copper (Cu) interconnect core on the second layer in the interconnect trench, wherein the second layer clads the Cu interconnect core in the interconnect trench; and
    a cap on a top surface of the Cu interconnect core, the cap including a cap material, wherein the cap material is the same as the second layer material, thereby cladding the top surface of the Cu interconnect core with the second layer material, wherein the cap has a bottommost surface below an uppermost surface of the ILD layer, the bottommost surface of the cap below an uppermost surface of the first layer, and wherein the cap is over an uppermost surface of the second layer.

13. The integrated circuit device of claim 12, wherein the second layer has a thickness in a range of 1 nm to 3 nm.

14. The integrated circuit device of claim 12, wherein the second layer provides for formation of a conformal Cu seed layer.

15. The integrated circuit device of claim 12, wherein the second layer reduces Cu diffusion along the interface between the Cu interconnect core and the second layer.

16. The integrated circuit device of claim 12, wherein the second layer is a bilayer structure including a third layer and a fourth layer.

17. The integrated circuit device of claim 16, wherein a thickness of the third layer and a thickness of the fourth layer are uniform, such that a thinnest part of each layer is within 5% of a thickest part of each layer.

18. A method for forming a cladded metal interconnect structure, the method comprising:
    forming an interlayer dielectric (ILD) layer having an interconnect trench therein, the interconnect trench having sidewalls and a bottom;
    conformally depositing a conformal first layer on the sidewalls and the bottom of the interconnect trench;
    selectively depositing a second layer on the conformal first layer, the second layer including an adhesion layer material, wherein the second layer material includes at least one of osmium (Os), gold (Au), platinum (Pt), palladium (Pd), iridium (Ir), silver (Ag), and rhodium (Rh);
    depositing an interconnect metal in the interconnect trench such that the second layer clads the interconnect metal in the interconnect trench; and
    selectively depositing a cap on a top surface of the interconnect metal, the cap including a cap material, wherein the cap material is the same as the second layer material, wherein the cap has a bottommost surface below an uppermost surface of the ILD layer, the bottommost surface of the cap below an uppermost surface of the first layer, and wherein the cap is over an uppermost surface of the second layer.

19. The method of claim 18, further comprising at least one of: depositing a seed layer onto the second layer; and recessing excess interconnect metal formed outside the trench.

* * * * *